United States Patent
Menzel

(10) Patent No.: US 6,965,189 B2
(45) Date of Patent: Nov. 15, 2005

(54) BENDING ACTUATORS AND SENSORS CONSTRUCTED FROM SHAPED ACTIVE MATERIALS AND METHODS FOR MAKING THE SAME

(75) Inventor: Christoph P. Menzel, Madison, CT (US)

(73) Assignee: Monodrive Inc., Menlo Park, CA (US)

( * ) Notice: Subject to any disclaimer, the term of this patent is extended or adjusted under 35 U.S.C. 154(b) by 68 days.

(21) Appl. No.: 10/251,217

(22) Filed: Sep. 20, 2002

(65) Prior Publication Data

US 2004/0056567 A1 Mar. 25, 2004

(51) Int. Cl.[7] .......................... H01L 41/08; H01L 41/07
(52) U.S. Cl. ...................................... 310/330; 310/328
(58) Field of Search ........................ 310/328, 330–332, 310/359, 367, 365; H01L 41/07, 41/09, 41/08

(56) References Cited

U.S. PATENT DOCUMENTS

| | | | |
|---|---|---|---|
| 4,862,029 A | * | 8/1989 | Kasai et al. ................ 310/330 |
| 4,929,860 A | | 5/1990 | Hulsing, II et al. |
| 4,999,819 A | | 3/1991 | Newham et al. |
| 5,415,175 A | | 5/1995 | Hanafy |
| 5,438,998 A | | 8/1995 | Hanafy |
| 5,461,274 A | * | 10/1995 | Yuji et al. .................... 310/330 |
| 5,471,721 A | | 12/1995 | Haertling |
| 5,615,029 A | | 3/1997 | Moddel et al. |
| 5,657,295 A | | 8/1997 | Howard |
| 5,729,077 A | | 3/1998 | Newham et al. |
| 6,329,741 B1 | * | 12/2001 | Vartuli et al. ................ 310/330 |
| 6,411,010 B1 | | 6/2002 | Suzuki et al. |
| 6,414,418 B1 | | 7/2002 | Heinz et al. |
| 6,717,337 B2 | * | 4/2004 | Howarth et al. ............ 310/328 |
| 6,734,603 B2 | * | 5/2004 | Hellbaum et al. .......... 310/330 |

* cited by examiner

*Primary Examiner*—Darren Schuberg
*Assistant Examiner*—Karen Addison
(74) *Attorney, Agent, or Firm*—Robert Curcio; DeLio & Peterson, LLC

(57) ABSTRACT

Bender devices are demonstrated by developing non-uniform fields within a homogeneous, non-planar single slab active member material of non-uniform thickness through geometrical constraints and electrode placement. Single slab actuators are demonstrated for semiconductor designs including MEMS applications. Single slab bender periodic designs are demonstrated to be well suited for MEMS fabrication. Shaped actuators having a topological pattern formed across at least one portion are demonstrated to induced strain at the patterned portion of the actuator, causing the patterned portion to flare into open and close positions upon application of an external field. Voltage transformers, spark generators, power sources, and sensors are developed using the non-planar, homogeneous, single slab active member material of non-uniform thickness. Last, semiconductor process design techniques are demonstrated for periodic and other non-planar single slab actuators.

40 Claims, 15 Drawing Sheets

Member Shape w/ Field

63°/50% Limited Top
Electrode Actuator anisotropically etch opening

Mask and metalize spin coat sol-gel piezo and metalize top metalization

Mask (polyimide), Metalize

Second Masker (polyimide), Etch

Fill with Piezo (sol-gel) then Pattern, Metalize

3rd Mask(polyimide), Etch, Fill, Metalize

BENDING ACTUATORS AND SENSORS CONSTRUCTED FROM SHAPED ACTIVE MATERIALS AND METHODS FOR MAKING THE SAME

BACKGROUND OF THE INVENTION

1. Field of the Invention

The present invention relates to actuators, and sensors, and specifically to bending actuators and sensors. More specifically, the present invention relates to the generation of a non-uniform strain-inducing field within a single slab bending actuator and the generation of asymmetric fields in a bending sensor, having a predetermined geometry and non-uniform thickness.

2. Description of Related Art

For a large class of materials, the material properties such as strain and stress, and the like, can be changed and controlled by the application of an external energy, typically in the form of a field. Materials that exhibit these effects are considered "active materials." As an example, electric, magnetic, and electromagnetic fields induce changes in physical properties of certain materials. More specifically, the application of an electric field to a piezoelectric material changes the overall shape of the material in known, repeatable ways. Electrostrictive, magnetostrictive, and electro-optic materials, are additional examples of active materials. The properties for a mechanically active member material are generally represented by the following strain equation:

$$\epsilon = \Sigma_i k_i * F^I$$

where, $\epsilon$ is strain;

$k_I$ represents proportionality constants, and, $F^I$ is the applied field strength, raised to the ith power.

Essentially, any material that allows for field-induced deformations may be utilized as an active member for an actuator or bender.

Piezoelectric materials are one example. The following equations represent one form of these relationships:

$$S = d \cdot E + s \cdot T$$

$$D = g \cdot S + \epsilon \cdot E$$

where

S and T are the strain and stress matrices;

E is the electric field;

D is the displacement field vector;

d and g are the piezoelectric strain and field constant matrices, respectively;

s is the mechanical compliance constant; and $\epsilon$ is the dielectric constant.

Many materials, naturally existing in crystalline form, are piezoelectric. Quartz is one prevalent example. Other materials, such as Barium Titanate, and Lead Zirconate Titanate (PZT) are ceramics, fabricated with randomly oriented piezoelectric domains. The randomness of the domains in an initially fabricated state causes the cancellation of the intrinsic piezoelectric effects for samples large relative to the domain size. However, upon the application of a sufficiently large electric field, called the coercive field, the domains align and the bulk material becomes "piezoelectric". Furthermore, this field establishes a preferred axis within the material. The act of aligning the domains is called "poling" the material.

Active materials have been utilized to make actuators, acoustic devices, passive filters and resonators, inertial and pressure sensors, and voltage generators and transformers.

Actuators, devices that have the ability to do mechanical work on command, can be constructed from active materials. Typically, actuators comprise mechanical members with defined stiffness, where the architecture of the actuator member is such that upon the application of an external field the active material of the actuator member is deformed. There are a number of distinct classes of actuators: stacked, flex-tensional and "morph" actuators. The various classes exhibit different functional characteristics in terms of actuation principle, actuation distance, often referred to as travel, mechanical compliance, frequency response, and power consumption. The instant invention is directed to actuators that bend as a result of internally induced moments. Hence, devices of the instant invention are improvements on morph style actuators.

The class of active member actuators, called morphs, converts induced strains into moments and causes the active member to bend. Morphs are sometimes referred to as "benders" since the member bends during actuation. Piezoelectric morphs work like bimetallic springs driven by electric fields rather than temperature. In this way, morphs exploit the electric field to stress/strain relationship to form actuators. Morphs utilize coplanar geometries where the attached electrodes are on substantially plane, parallel sides. This coplanarity promotes field uniformity within the device, which in turn, is essential to the device function. Furthermore, morphs are completely unrestrained over at least some large portion of their extent to allow bending. As actuators, morphs are important because of their very large travel during actuation.

Unimorph designs are constructed by bonding a plane, parallel, active slab, such as a piezo-ceramic, to a plane parallel inactive slab. Driving or actuating the active slab generates moments within this multi-slab structure. These generated moments cause the entire unimorph structure to bend. Unique to a unimorph design, only one part of the device, the active slab, is directly subject to, and under the influence of, a voltage potential. Importantly, if an inactive slab is not bonded to an active slab, no moments are generated within the active slab and the active slab does not bend, though it will elongate.

A prototypic unimorph configuration is shown in FIG. 1. One slab of metallized piezoelectric material 2 is poled. As shown in FIG. 1A, it is bonded to an inactive slab 3 along their large planar surfaces with an inner electrode 4 between them. A voltage difference is applied across electrodes 4, 5 to generate an electric field inside the active slab. The result 7 is that a moment is generated causing the bonded pair to bend as depicted in FIG. 1B. Morphs utilize thin slabs, actuate in the device's thickness direction and develop significant internal stresses when actuated. Note that these internal stresses develop even if the material is unloaded during actuation.

Bimorph and multi-slab morph designs are also constructed from plane, parallel, multiple slabs bonded together. In bimorph and multi-slab morph designs; fields are generated in each layer or slab. Bonding two pieces of active substrate together, such as two pieces of piezoelectric material, makes a bimorph, so that differential changes in length of the two pieces can produce relatively large deflection movements perpendicular to the direction of elongation. FIG. 2 depicts a standard bimorph (two-slab) actuator. FIG. 2A depicts a bimorph rectilinear-shaped member 10, first shown without an external field applied. As with all bimorphs, two slabs of active material are bonded together. In this configuration, a voltage difference is applied across three independent electrodes. Voltage is applied between an electrode attached to the top surface 12 and an electrode attached between the two slabs 14. A voltage difference is also applied between electrode 14 and an electrode attached to the bottom surface 16. FIG. 2B denotes a cross-sectional view of the bimorph member 10 of FIG. 2A under an applied electric field. The electric field 19 induced within the member 10 is perpendicular to the surface and parallel to the poling direction 21. Regions of high strain 18 and regions of reverse strain 20 are shown. Moments developed within active member 10 cause the member to bend in order to minimize the total strain energy. FIG. 2C depicts member 10 in its altered shape. High strain region 18 is evident on the top surface, while low strain region 20 is depicted on the bottom surface.

Other bimorph designs exist where two piezoelectric slabs of opposite polarization are bonded together and the applied field maintains the same direction though both slabs, going from an electrode on the top surface of the top slab to the bottom surface of the bottom slab. Multi-layer morphs consist of a plurality of individual slabs of active material, three or more, each with a potentially different applied field and poling direction.

The active slabs used in morph actuators are substantially rectilinear and have rectangular cross-sections. Surfaces of these actuators are plane and parallel such that the slabs have a uniform thickness. As such, electrodes on opposing surfaces induce electric fields that are substantially uniform within active slabs. Field uniformity within each active slab increases the effectiveness of the actuation and hence leads to larger actuation travel for a given applied field. These types of actuators find application in a variety of devices. Typically, they are long, thin, narrow devices, or thin circular diaphragms and membranes. Geometries of these types of devices are structured to maximize the field uniformity within the device.

In U.S. Pat. No. 5,471,721 issued to Haertling on Dec. 5, 1995, entitled, "METHOD FOR MAKING MONOLITHIC PRESSTRESSED CERAMIC DEVICES" a monomorph bender is taught produced by reducing one side of a high lead containing piezoelectric or electrostrictive material by a high temperature chemical process. This high temperature chemical process converts the initially homogeneous member into a non-homogeneous slab having different piezoelectric activity levels through its thickness. This non-uniform piezoelectric activity leads to moments when stimulated with a uniform field. Here, as with the other morphs, uniform fields within the slab are desired as they improve the efficiency of the actuator.

Bonding piezoelectric materials to a metal slab is difficult and, in fact, many morph device failures are attributable to the metal/piezoelectric material interface. Often, this bonding layer occurs near the center of the device thickness and precisely at the location and along the direction of greatest sheer stress within the device.

The large stresses inherently present in the active slabs of morphs have other deleterious effects on actuator function. For example, large stresses contribute to device aging. Aging is the long-term process through which the organizing effects of poling are reversed and the material returns to its randomly organized, inactive state. In addition, the large internal stresses contribute to material failure.

The piezoelectric phenomenon is bidirectional. Therefore, just as electrical energy will cause a mechanical reaction in the form of stress or strain depending on the mechanical boundary conditions, applied mechanical loading in the form of applied stresses or enforced displacements will generate corresponding electrical reactions in the form of charge or voltage depending on the specific electrical boundary conditions. Piezoelectric sensors exploit this mechanical loading to electrical reaction relationship.

Morph devices may also be used as sensors. The principle sensing applications are point loads sensing, distributed loads such as pressures sensing and acceleration sensing through detection of the loading caused by its own mass or the loading caused by a proof mass. The devices themselves are constructed in the same manner as actuators: two regions of different piezoelectric activity are bonded together. In use, the electrodes are connected to measurement circuits instead of driving circuits. As a mechanical load sensor, the morph is configured to experience a bending moment from the signal of interest. The moment establishes a non-zero average stress between opposing electrodes. In turn, this non-zero average stress generates either a voltage difference between the electrodes or excess charge on the electrodes, depending on the measurement circuit used.

The average stress developed between opposite sides of a single layer, plane, parallel, homogeneous slab subjected to a bending moment will be zero and hence does not result in an output signal. Thus, single layer, plane parallel homogeneous active member slabs cannot be used independently as bending sensors. Homogeneous, plane parallel slab sensors require two separate regions. Two active piezoelectric regions, such as that depicted within a bimorph construction, may define the two regions, or the two regions may be defined by one active piezoelectric region bonded to one inactive region as depicted in a unimorph design. Since the second slab is crucial to the functionality of the device, all the complexities and problems described above in the fabrication and function of morph style actuators are also present in morph style sensors.

The architecture inherent in morph style actuators and sensors is difficult to implement in millimeter and sub millimeter devices. The difficulties come from using discrete components to obtain the regions of different piezoelectric activity required to make a unimorph or bimorph style device. The task of assembling individual components becomes burdensome as these discrete components become small and correspondingly delicate. As such, Micro-Electro-Mechanical Systems (MEMS) scale morphs are currently fabricated using sputtered and sol-gel films along with subsequent etching steps to define the outline. These deposition processes have associated problems. The elevated temperatures required during these processing steps lead to large residual stresses due to coefficient of thermal expansion, CTE, mismatches between the various layers required by morphs for actuation. In addition, film densification causes further shrinkage and leads to more residual stress. Hence, finished, room temperature devices exhibit large internal stresses, curling and other similar effects. These effects are accentuated in bimorph designs and consequently, bimorphs are not used in piezoelectric MEMS designs. In addition, for devices with significant internal stress, maximum allowable deflections may need to be reduced in order to remain within the material's allowable maximum stress. The CTE mismatch issues remain with the device making the actuator inherently sensitive to temperature changes in the environment. In addition, as devices get smaller, the thickness of bonding layers and inactive layers, caused by contamination or material composition changes during processing, get relatively bigger, increasingly impacting the efficiency of the device. For layered MEMS devices, layer to layer bonding failure represents a significant reliability problem.

Another characteristic of sub millimeter devices is that the stiffness or mechanical impedance of the devices diminishes rapidly due to the relationship between stiffness and member thickness. This reduced stiffness limits the application of small morph actuators to very low force application. In addition, it is difficult to find stable, non-active layers of a workable thickness sufficiently compliant relative to the stiffness of the active layer for efficient actuation.

Consequently for the fabrication of devices at the millimeter, sub millimeter and MEMS scale, there is a need for bender device architectures that reduce residual internal stress. Furthermore, there is a need to reduce the sensitivity of small bender devices to thermal changes. In addition, there is a need to increase the mechanical impedance of small morph style actuators. Still further, for small devices, there is a need for an architecture that does not require the assembly of discrete components.

Bearing in mind the problems and deficiencies of the prior art, it is therefore an object of the present invention to improve the characteristics of small size scale morph style bending actuators.

It is another object of the present invention to provide a simplified bending actuator and bending sensor.

A further object of the invention is to provide a bending actuator and sensor that has reduced internal stress.

It is yet another object of the present invention to provide a single slab, homogeneous material, bending actuator and bending sensor design for MEMS applications that does not suffer from deposition stress or metallic bonding failures.

A further object of the invention is to provide a bending actuator that has increased stiffness.

Another object of the present invention is to provide a method of making a single slab, homogeneous material bending actuator.

Still other objects and advantages of the invention will in part be obvious and will in part be apparent from the specification.

SUMMARY OF THE INVENTION

The above and other objects, which will be apparent to those skilled in art, are achieved in the present invention, which is directed to, in a first aspect, an apparatus for actuation comprising a non-planar shaped, single active member slab of continuous homogeneous material and non-uniform thickness for bending, the apparatus having non-uniform fields induced therein when subjected to an external field, the non-uniform fields defined by the non-planar shape and generating moments to bend the apparatus. The non-uniform fields are defined by the non-planar shape and electrode placement on the single active member slab. The apparatus bends in response to induced strain developed from the non-uniform fields. A single layer of continuous homogeneous piezoelectric, electrostrictive or magnetostrictive material may be employed. The external field can be electric, magnetic, or electromagnetic fields. A non-rectilinear shape may be adapted to alter internal fields induced by the external field and enhance field non-uniformity therein. The active member slab may also be a piecewise planar slab.

In a second aspect, the present invention is directed to an apparatus comprising a non-planar shaped, single active member slab of continuous homogeneous material and non-uniform thickness for sensing, the apparatus having fields induced therein when subjected to an external energy, the fields defined by the non-planar shape and generating non-zero average electrical reactions to the external fields, causing the apparatus to sense. The apparatus induces a potential difference across portions or the entire single layer active member when the active member is subjected to the external energy. The external energy may include infrared radiation, electric fields, magnetic fields, pressure, acceleration, or mechanical loading.

In a third aspect, the present invention is directed to an apparatus for bending comprising a continuous homogeneous, single active member slab of non-planar geometry having a first portion and a second portion, the apparatus having non-uniform fields induced therein when subjected to an external field, the non-uniform fields producing approximately no strain in the first portion and strain responsive to the non-uniform fields in the second portion.

In a fourth aspect, the present invention is directed to an apparatus for bending comprising a continuous homogeneous, single active member slab of non-planar geometry having a first active portion and a second active portion, the apparatus having non-uniform fields induced therein when subjected to an external field, the non-uniform fields producing strain fields responsive to the external fields, the strain fields induced in the first active portion different from the strain fields induced in the second active portion.

In a fifth aspect, the present invention is directed to a periodic actuator having plates, beams, a top and bottom surface, comprising a non-planar shaped, single layer active member of homogeneous material having a topological pattern repeated across at least one surface of the active member, the periodic actuator having non-uniform fields induced therein when subjected to an external field, the non-uniform fields defined by the non-planar shape and causing strain to vary inside the member in a manner that causes the member to bend In a sixth aspect, the present invention is directed to a voltage transformer comprising a non-planar shaped, single active member slab of continuous homogeneous material and non-uniform thickness, a first electrode pair, and a second electrode pair, the transformer having non-uniform fields induced therein when a first potential difference is applied across the first electrode pair, the non-uniform fields defined by the non-planar shape and causing the transformer to generate a second potential difference across the second electrode pair.

In a seventh aspect, the present invention is directed to a method for making a periodic actuator comprising: a) applying an SOI or epi/boron etch stop to a silicon wafer top surface; b) anisotropically etching a periodic geometric pattern of non-planar openings in the silicon wafer top surface; c) masking and metallizing the silicon wafer top surface; d) applying at least one coat of homogeneous material to create a single active member slab of non-planar shape, the slab adapted to form non-uniform fields therein when subjected to an external field; and e) metallizing the silicon wafer top surface.

In an eighth aspect, the present invention is directed to a method for making an actuator comprising: a) applying a first patterned layer of metal to a top surface of a silicon wafer; b) applying a first polyimide to the top surface and the first patterned layer of metal; c) applying a second patterned layer of metal, the second layer being adjacent to the first layer, and not overlapping the first layer; d) applying a second polyimide; e) etching the wafer; f) filling etched portions of the wafer with a single layer of homogeneous material adapted to form non-uniform fields therein when subjected to an external field; g) metallizing a third patterned layer of metal on the top surface over the second patterned layer of metal; h) applying a third polyimide to the wafer; i) etching the wafer and filling etched portions with the single slab of homogeneous material; and j) metallizing the single slab of homogeneous material exposed.

In a ninth aspect, the present invention is directed to a bending actuator comprising a non-planar shaped, single active member slab of continuous homogeneous material, the slab including a top, a bottom, a non-uniform thickness, a bending portion, a predetermined direction of bending, the top and bottom aligned in the predetermined direction of bending; the bending portion mechanically unrestrained in the predetermined direction of bending.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
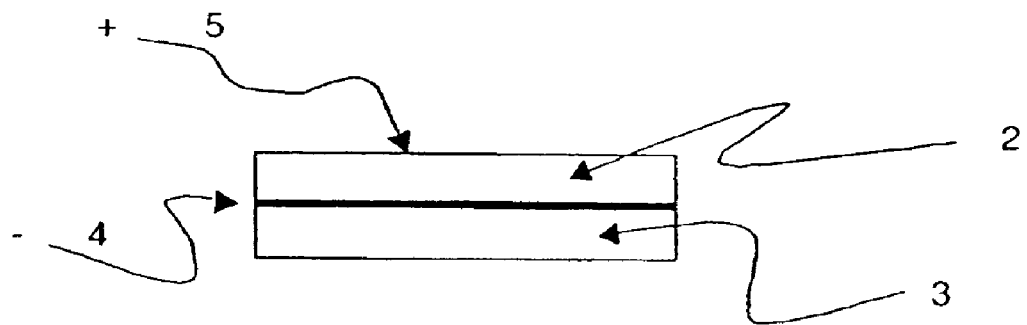
FIG. 1A is a cross-sectional view of a unimorph, piezoelectric bender.
Figure 1B:
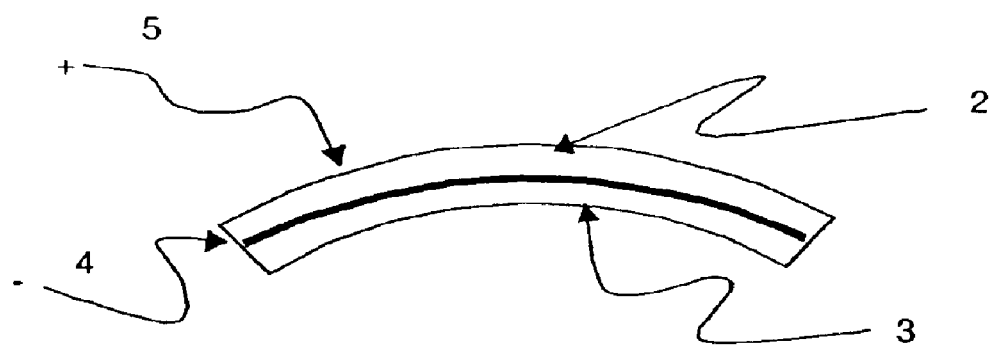
FIG. 1B depicts the bonded piezoelectric slab of FIG. 1A under an applied voltage, demonstrating bending.
Figure 2A:
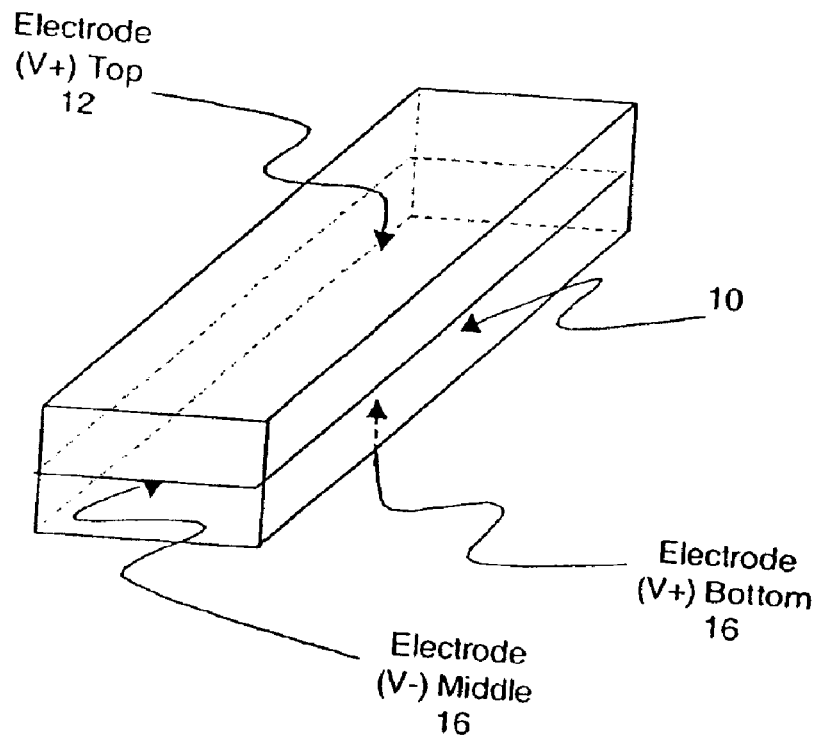
FIGS. 2A–2C depicts a standard bimorph (two-slab) actuator.
Figure 2B:
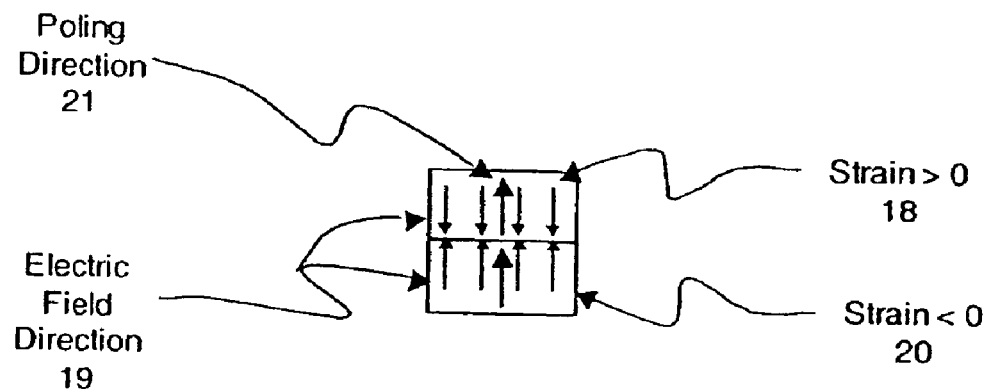
Figure 2C:
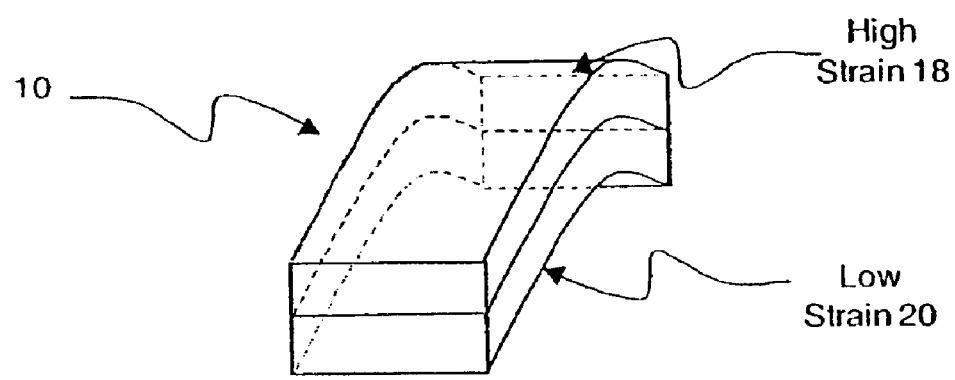

In describing the preferred embodiment of the present invention, reference will be made herein to FIGS. 1–15 of the drawings in which like numerals refer to like features of the invention.

The present invention relates to the use of active materials for which the physical properties and electromechanical state functions of the material are responsive to applied energy fields. A shaping of the external topology generates within the material non-uniform fields for the express purpose of exploiting the resulting non-uniform distribution of physical properties or the electromechanical state functions established as a result of the external topology for generating moments and bending the member. In one embodiment, an actuator based on bending is presented. The bending is caused by a non-uniform strain-inducing field generated within a single homogeneous slab of a non-planar geometry and non-uniform thickness. In another embodiment, a sensor is presented through the use of a single slab of homogeneous active material with a non-planar geometry and non-uniform thickness to generate a measurable electromechanical output responsive to a parameter to be measured when the member is subjected to an applied moment. A further embodiment uses different thickness of the non-planar geometry and non-uniform thickness to generate differential signals when subjected to bending moments or in-coming electromagnetic radiation. In yet another embodiment, a single homogeneous slab of active material, of non-uniform thickness and non-planar geometry is used for the generation of electrical signals or power generation through mechanical loading and voltage transformation through a mechanical linkage.

Shaped Bending Actuators

A new construction of active material bending actuators is proposed that uses non-uniform fields within a single active member slab of continuous homogeneous material of non-uniform thickness to generate bending moments. These non-uniform fields are developed from non-planar active member geometries, which are used to shape the fields inside the active member slab. The measurable physical parameters are responsive to the distribution of the non-uniform fields. Parameter changes include force related properties such as stress and strain, and the like. Depending upon the member material the applied energy may be electric, magnetic, electromagnetic, or mechanical in character. Moments are generated within the bending actuator as a result of the externally induced non-uniform fields. Mechanical boundary conditions allow these moments to cause significant bending of the member.

Bending actuators utilizing the present invention are active members responsive to different external field types, and are not limited to a particular type of input energy. Discussion below is presented for demonstrative purposes to an applied electric field inducing a deformable change in an active material, specifically a piezoelectric material such as PZT, generally through an induced change in a mechanical parameter, such as strain; however, the instant invention is clearly not limited solely to piezoelectric materials, electric fields or force parameters. Other field applications, for example, magnetic or electromagnetic, may be considered, which can generate deformable changes in active materials through induced force parameters.

Electric field gradients within an active member are dependent upon the boundary conditions or physical exterior shape of the member and the electrode configuration. Unlike the uniform fields generated by the substantially plane, parallel slabs and plates utilized in standard morph actuators, members with non-plane, planar shapes alter the internally induced fields and cause field non-uniformities. These non-uniformities generate moments within the active member that in turn cause bending. Actuation in these types of devices occurs as the member bends to maintain minimum strain energy. Like all bender actuators, the bending is perpendicular to the direction of the induced strain. Unlike morph actuators, however, the instant invention does not require multiple slabs or inhomogeneous materials in the member to effectuate member bending or deformation.

Figure 3A:
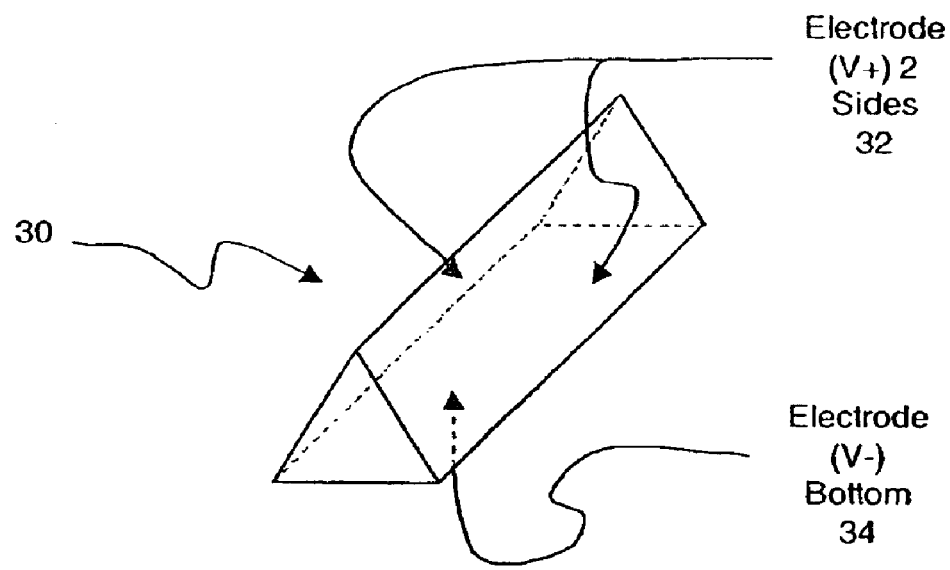
FIGS. 3A–3C depicts a shaped actuator of the present invention.

FIG. 3A depicts one embodiment of a continuous, homogeneous, single slab shaped active member 30 of the instant invention with a non-planar geometry devised to generate moments inside the homogeneous slab. The non-uniform electric fields generate non-uniform strain fields. In this example, a triangular rod shape is depicted to exemplify the field non-uniformities; however, many other non-planar shapes can be used to effectuate field non-uniformity, and the present invention is not limited to any one particular shape. Importantly, using field non-uniformities, a single slab of a continuous homogeneous active member can be used as a bending actuator. Non-rectilinear shapes, shapes without straight-edged surfaces, and shapes having non-uniform thickness across electrodes, including piecewise planar shapes, may also be used to promote field non-uniformity.

Figure 3B:
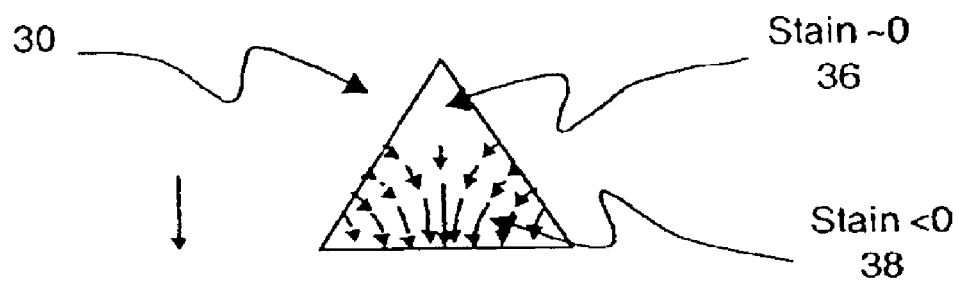
Figure 3C:
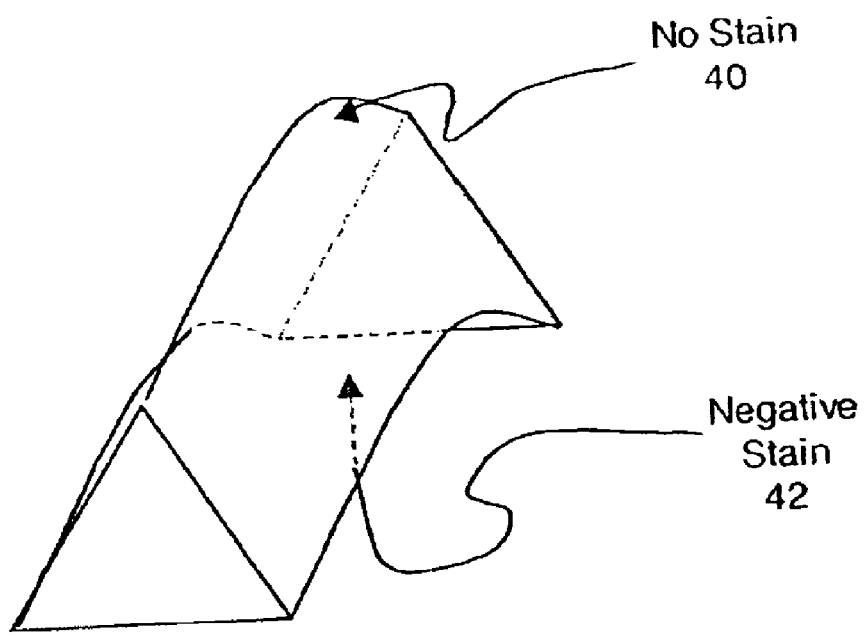

In the instant example, a voltage difference is applied across electrode 32, attached to two of the three surfaces of triangular member 30, and electrode 34, attached to the remaining outer surface. FIG. 3B is a cross-sectional view of the non-uniform electric field generated within triangular member 30. There exists a region of virtually no electric field and virtually no strain 36 in the triangular member 30 and a region of significant electric field 38 and significant strain. In this way, a non-uniform stress/strain distribution through the thickness of the device is developed within a single slab of homogeneous material. The non-uniform stress/strain distribution will generate moments that lead to bending of the member. FIG. 3C represents the altered shape of the triangular member 30, depicting a region of virtually no strain 40 at the top surface and a region of negative strain 42 at the bottom surface. The specific non-planar member geometry causes the non-uniformity of the fields induced, allowing for actuation by bending of the member.

Bending actuators of the instant invention may be shaped to generate substantially linear strain fields through the thickness of the material when voltage differences are applied across the electrodes. In the limit, as the deviations from linearity of strain versus thickness vanish, the internal strain of the device in its actuated state approaches zero. Hence, shaped, single slab bending actuators of the instant invention, designed with geometries to generate substantially linear field distributions through the non-uniform thickness of the material, will have substantially reduced internal stresses in the member in the actuated state relative to standard morphs at the same level of actuation. Alternatively, shaped bending actuators can be designed to maximize deflection.

Figure 4:
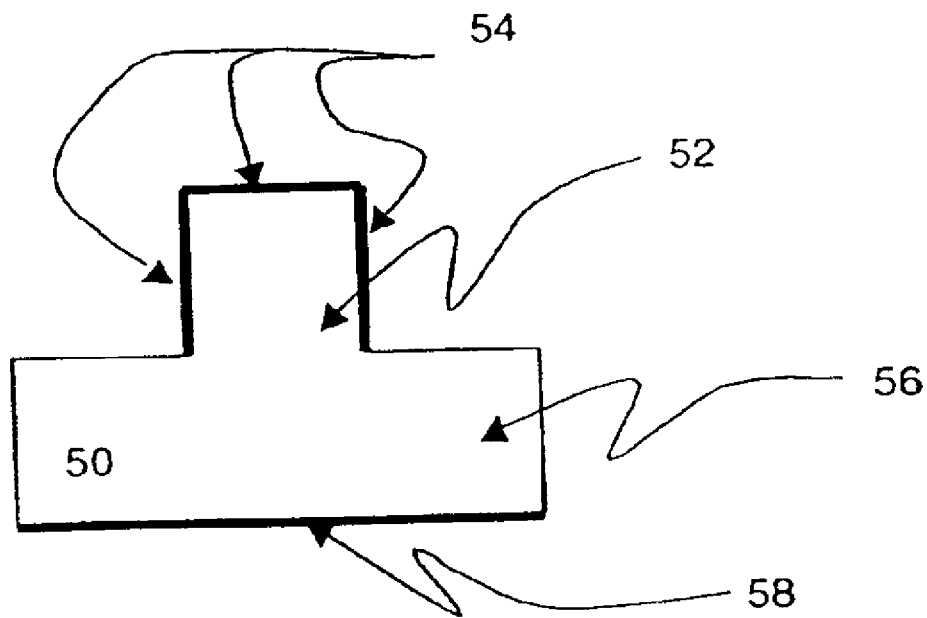
FIG. 4 depicts a shaped, single slab active member of non-uniform thickness with a top portion held at constant potential to simulate the fields of unimorph architecture.
Figure 5:
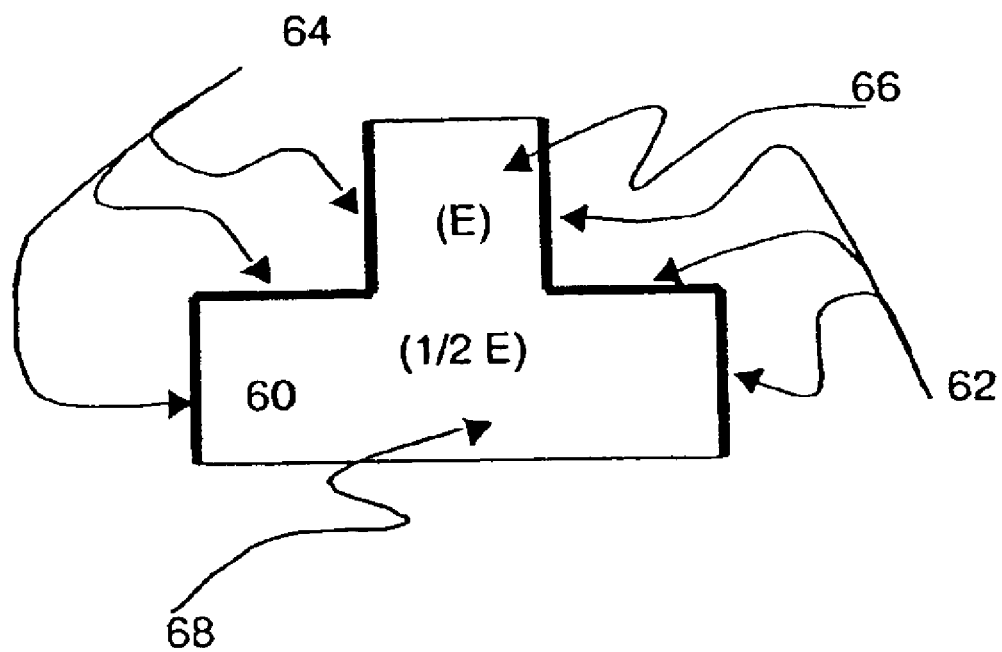
FIG. 5 depicts the electrode placement and applied potential difference across a shaped, single slab active member of non-uniform thickness to simulate the fields of bimorph architecture.

Other examples of shaped bending actuators are depicted in FIGS. 4 and 5. FIG. 4 depicts a piecewise planar, non-rectangular, single slab active member 50 with a top portion 52 connected or plated into one single electrode 54, held at constant potential relative to bottom electrode 58, that restricts the induced field within the top portion 52 to nearly or approximately zero, making it non-responsive to the external field, since each side of the top portion is effectively at the same potential, whereas the bottom portion 56 will have induced strain. This design mimics a unimorph device in that one portion has a near-zero field similar and equivalent to the non-active slab of a unimorph, while a second portion has induced strain like the active slab or layer of a unimorph.

FIG. 5 depicts a second electrode placement configuration and applied potential difference across a piecewise planar, non-rectangular, homogeneous, single slab active member 60. An electrode 62 is attached to one side of the device, while a separate electrode 64 is attached to the corresponding side. The field strength (E) generated within the single slab will be twice as great within the top portion 66 as it is within the bottom portion 68 ($\frac{1}{2}$·E) due to the geometrical design. The single slab design will be bimorph-like in action, having a top active member portion and a distinct bottom active member portion of different field strengths, both of which have strain fields responsive to the externally applied field.

Periodic Bending Actuators

Figure 6A:
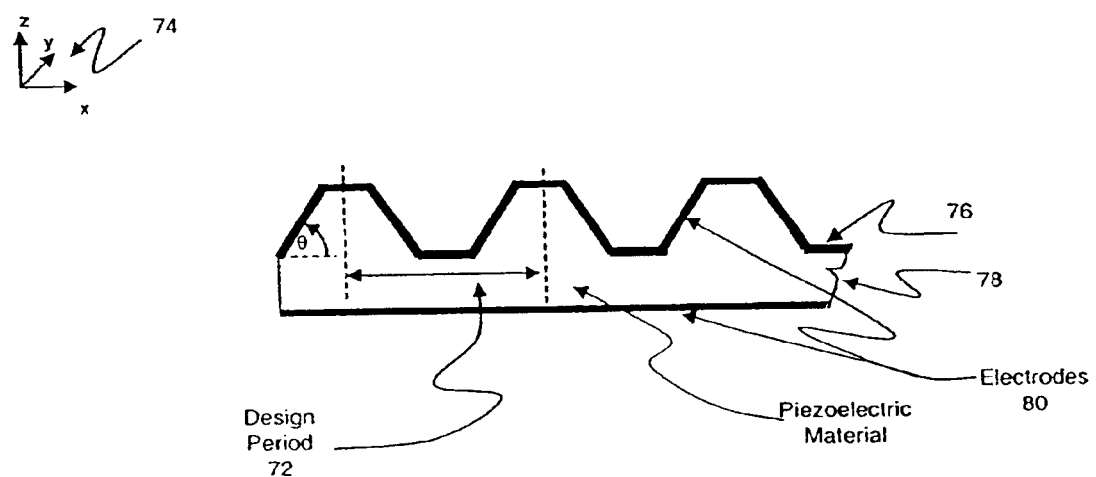
FIG. 6A depicts a cross-sectional view of a periodic actuator member.
Figure 6B:
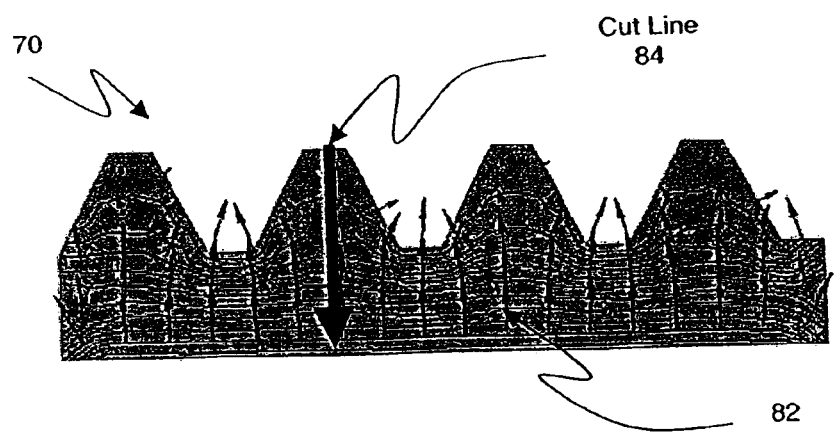
FIG. 6B depicts the electric field distribution induced in the actuator of FIG. 6A when the upper and lower electrodes are kept at a potential difference.
Figure 6C:
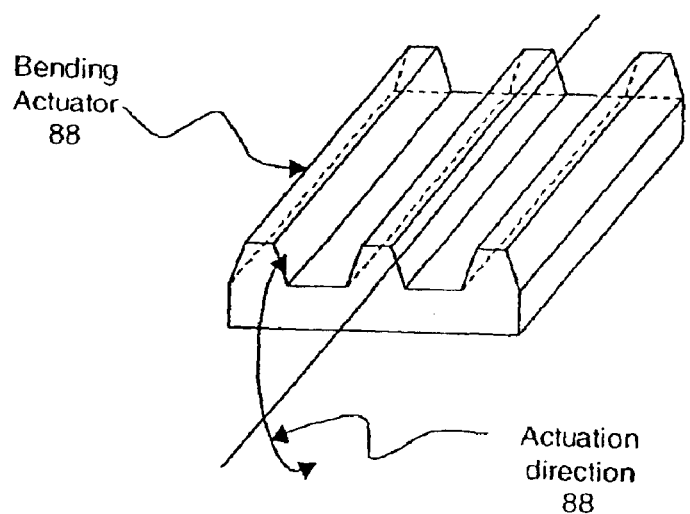
FIG. 6C depicts a top-angled view of periodic actuator device.

As noted, many different external shapes and electrode configurations can lead to non-uniform internal fields and hence, single slab actuation. Another embodiment of a bending actuator of the instant invention is a periodic bending actuator. Periodic bending actuators are devices where a periodic topology is repeated across the surface of the active member causing strain to vary inside the member in a manner that generates moments and causes the member to bend. FIG. 6A depicts a cross-sectional view of a periodic actuator member 70, preferably made of piezoelectric material having a geometric design period 72. The member is oriented along the directions indicated by the x-y-z directional vectors 74. This shape could represent the cross section of a beam or the cross section of a plate. As indicated, the top surface 76 and bottom surface 78 of the periodic bending actuator member are not equidistant. Electrodes 80 may be placed on each surface or portions thereof. FIG. 6B depicts the electric field distribution induced in the member material when the upper and lower electrodes are kept at a potential difference. Contour lines of the resulting field strength 82 are shown to be non-uniform. Importantly, as depicted by the contour lines, the field density changes with thickness. FIG. 6C depicts an elevated view of a periodic shaped bending actuator 86 indicating the actuation or bending direction 88. Alternatively, the topology of the device could be oriented 90° away from the direction shown in FIG. 6C.

In a periodic bending actuator circular plate or rectangular plate implementation, two-dimensional bending will occur to form a dome.

Figure 7:
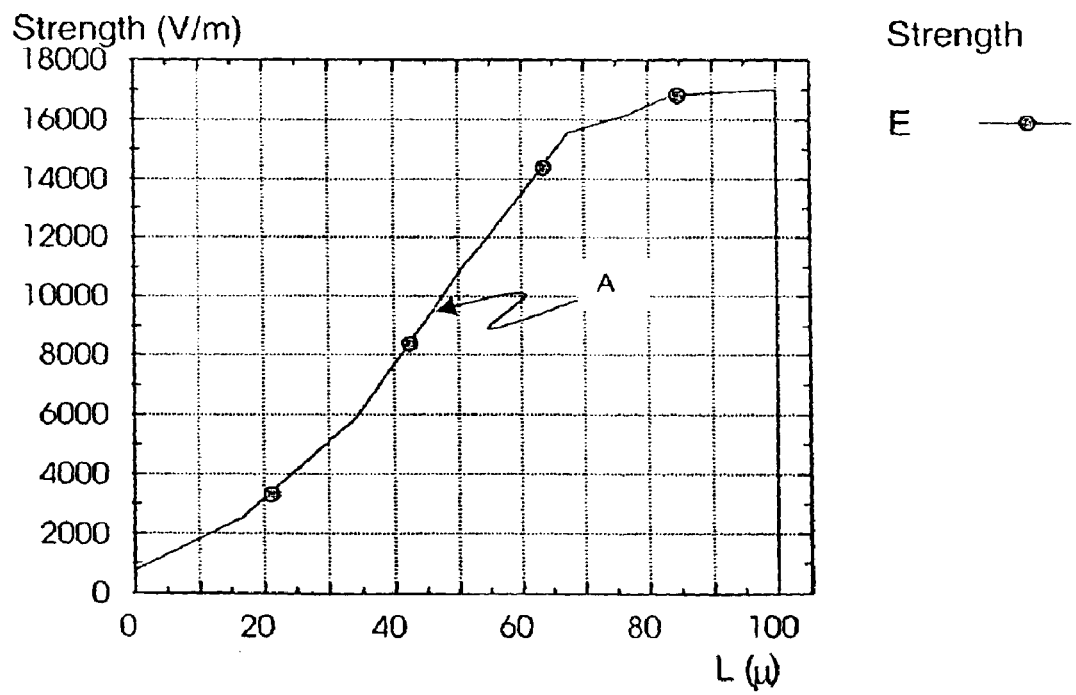
FIG. 7 is a graph of the electric field strength as exhibited along the cut-line of FIG. 6B.

FIG. 7 is a graph of the electric field strength as exhibited along the "cut-line" 84 of FIG. 6B. The electric field strength, measured in volts/meter, is indicated by line A, and shown to be increasing as a function of thickness in micrometers. As can be seen from FIGS. 6 and 7, the electric field through the thickness of the member is not uniform. Correspondingly, the strain is also non-uniform. The member will necessarily bend to form an arc in the y-z plane. The specific geometric design shown here leads to substantially linear thickness dependence for the resulting strain field. As such, this design exhibits substantially reduced internal stress relative to an equivalent unimorph or bimorph actuator.

The design of FIG. 6 allows for the top electrode to cover the entire top surface of the member device. However, the device will function properly even if the electrode is only on the high plateaus or only in the low troughs or some combination thereof, including attaching electrodes to the sloping sides. Designs with a segmented electrode are designated Limited Top Electrode (LTE) designs.

In periodic bending actuator designs targeted at reducing internal stress, the sloping sides will have a preferred angle of approximately sixty degrees (60°) with respect to the x-axis as indicated by theta ($\theta$) of FIG. 6A. At a sixty-degree angle, strong bending moments are generated.

Figure 8:
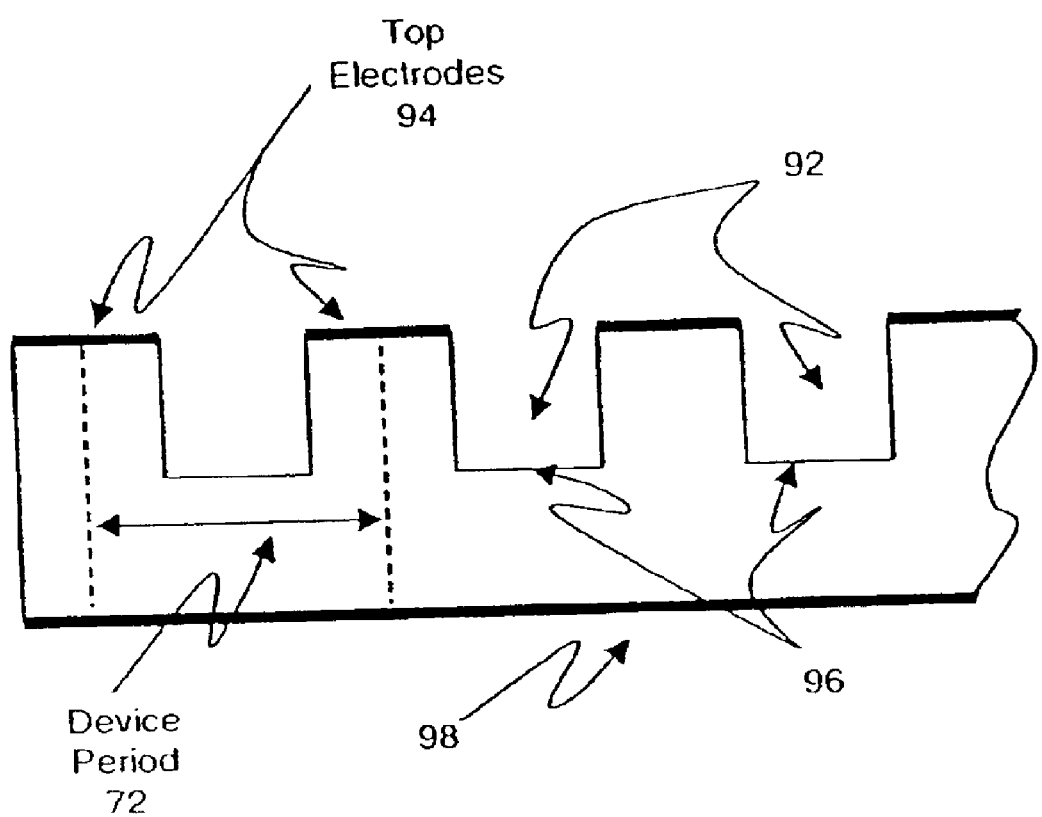
FIG. 8 depicts a cross-sectional view of a periodic actuator representing a slot-style cut.

FIG. 8 is a diagram of a second embodiment of a periodic bending actuator 90, representing a slot-style cut. In this design, simple slots 92, having all faces perpendicular to adjacent faces, are cut into the top surface. Top electrodes 94 are shown in a limited top electrode design with no electrode in the troughs 96 of the slot. Bottom electrode 98 is shown to be continuous across the bottom surface. A periodic actuator of this shape will allow a single slab active member to generate strong non-uniform field effects. These periodic actuator shapes are easily implemented in MEMS processing.

Shaped actuators, shaped to generate substantially linear strain fields through the thickness of the material when a voltage difference is applied, take on a new, low stress geometry in the actuated state. Whereas in the non-actuated state, the devices are long, straight members, in the actuated shape they are curved devices. This new curved, low stress geometry means that from a mechanical stiffness perspective, the beam may be treated mechanically as a curved beam. Similarly, a shaped actuator flat plate will be treated mechanically as a shallow dome or curved shell. It is well known that curved beams and domes are stiffer for a given geometry than their straight and flat counter parts. As a result, shaped devices with substantially linear strain fields through the thickness will be stiffer in the actuated state than their bimorph and unimorph counterparts. These shaped devices will then have high natural frequencies. Alternatively, a shaped device could be thinner thereby having a larger travel and still deliver the same mechanical impedance. These advantages are particularly advantageous for MEMS scale device dimensions and devices that exhibit large deflections as are common in MEMS geometry scales.

Figure 9A:
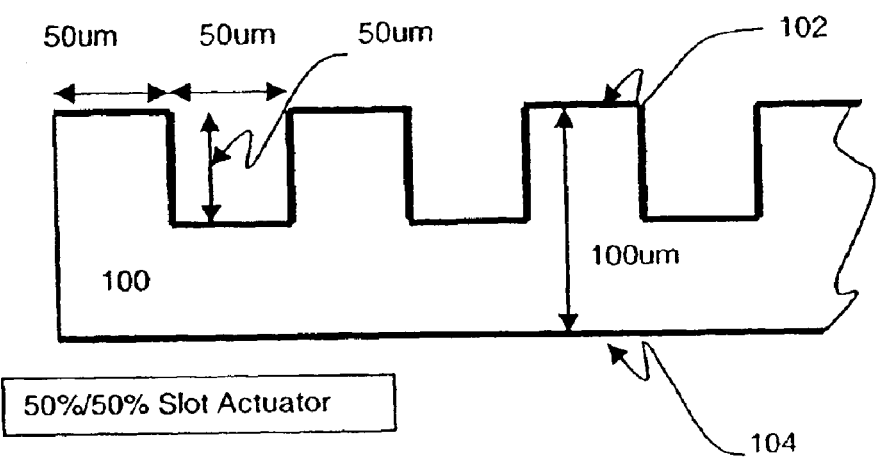
FIG. 9A depicts a 50%/50% Slot Actuator.
Figure 9B:
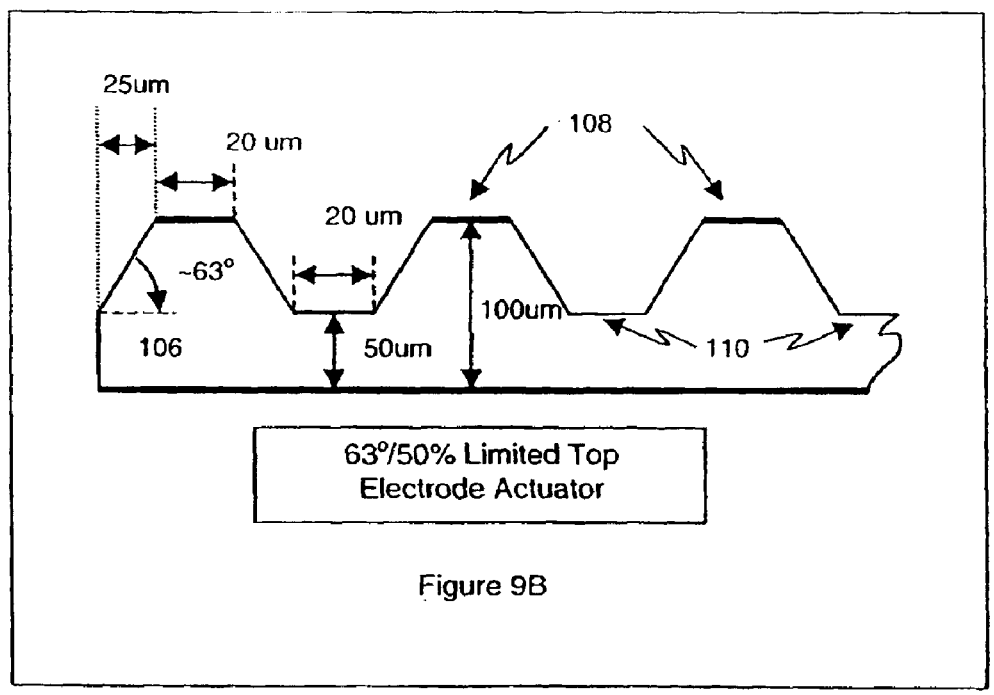
FIG. 9B depicts a 63°/50% limited top electrode actuator.
Figure 9C:
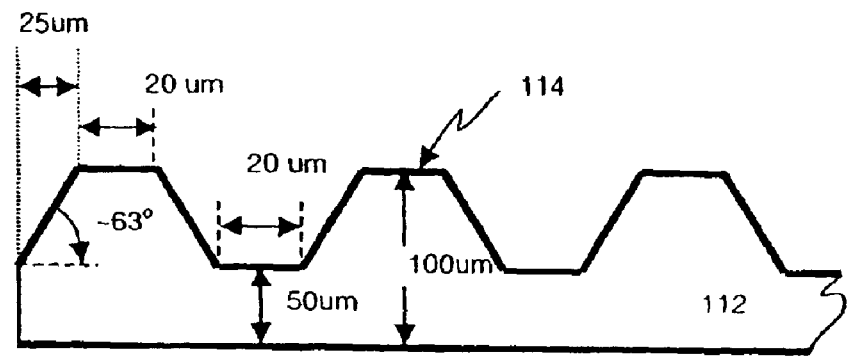
FIG. 9C depicts a 63°/50% actuator with full top electrode coverage.

Table I compares functional expectations of shaped, homogeneous, single slab actuators to a typical bimorph design under the following conditions: a) constant applied electric fields; b) constant power dissipation levels; and c) constant actuation deformation. Three shaped, homogeneous, single slab actuator designs are considered; a 50/50 slot design, a 63°/50% slot design, and a 63°/50% limited top electrode (LTE) slot design. Many of the design parameters are the same for this comparison, such as a maximum thickness (100 $\mu$m), piezoelectric strain coefficient ($d_{31}$) equal to $-200(10^{-12})$ coulombs/newton, a maximum allowable field of $1.7(10^6)$ volts/m, and Young's modulus (E) equal to $80(10^6)$ Pascals. Many of the actuator parameters, such as total capacitance, total resistance, and tip displacement, depend on the length and width dimensions and material constants of the actuator (Young's modulus, resistivity, and the like). These given functional parameters have been normalized with respect to length, width and material constants. The bimorph design is considered with a center electrode at a negative ½·V, and the top and bottom electrodes placed at a positive ½·V potential difference. The configurations for the shaped electrodes are depicted in FIGS. 9A–9C. FIG. 9A depicts the 50%/50% Slot Actuator 100. Electrodes are placed on the top surface 102 and bottom surface 104 respectively. Dimensions are given for exemplary purposes. FIG. 9B depicts the 63°/50% limited top electrode actuator 106. Top electrode 108 is placed on each individual peak, but not in the troughs 110.

FIG. 9C depicts a 63°/50% actuator 112 with full top electrode coverage 114.

TABLE I

Functional Comparison Of Periodic Bending Actuators to Bimorphs

| Parameter | Bimorph | 50/50 Slot | 63°/50% Slot | 63°/50% Slot (LTE) |
|---|---|---|---|---|
| Capacitance ($\epsilon/\epsilon_0$ * area) | $3.54(10^{-7})$ | $1.67(10^{-7})$ | $1.56(10^{-7})$ | $5.4(10^{-8})$ |
| Resistance * (area/$\rho$) = R | $2.5(10^{-5})$ | $5.29(10^{-5})$ | $5.68(10^{-5})$ | $1.64(10^{-4})$ |
| Real Power (re lowest device dB) | 6.6 | 3.1 | 2.9 | Lowest |
| Equalized Electrical Field (V/m = $1.69(10^6)$) | | | | |
| $R_0C$ meters | 0.10 | 0.26 | 0.32 | 0.52 |
| Stress (Mpa) | 26 | 5.2 | 4.5 | 6.4 |
| Voltage | 34 | 50 | 52 | 88 |
| Power ($V^2/R$) | $6.8(10^5)$ | $1.0(10^5)$ | $1.1(10^6)$ | $1.69(10^6)$ |
| Equalized Stress (4.5 Mpa) | | | | |
| $R_0C$ meters | 0.60 | 0.30 | 0.32 | 0.71 |
| Voltage | 14 | 70 | 81 | 65 |
| Field (V/m) | $2.8(10^6)$ | $1.5(10^6)$ | $1.68(10^6)$ | $1.25(10^6)$ |
| Normalized power ($V^2/R$) | $7.8(10^6)$ | $9.3(10^7)$ | $1.2(10^8)$ | $2.6(10^7)$ |

Table 1 demonstrates that at equal stress levels, periodic bending devices of the instant invention deflect significantly more than their bimorph counterpart. For shaped piezoelectric material, the values of capacitance area and resistance area were calculated using an integral number of periods. Additionally, the lumped parameter electrical model is a parallel RC. For parallel RC circuits in slabs, $Z=R/(1+l\omega\rho\epsilon\epsilon_0)$ and power is $|V^2/Z|$. The portion of the power controlled by design geometry is dependent upon R only. Thus, a major difference between periodic bending actuators and bimorphs is that the internal stress is considerably less in the single slab shaped periodic bending actuator design for an equivalent amount of deflection or bending.

Figure 10:
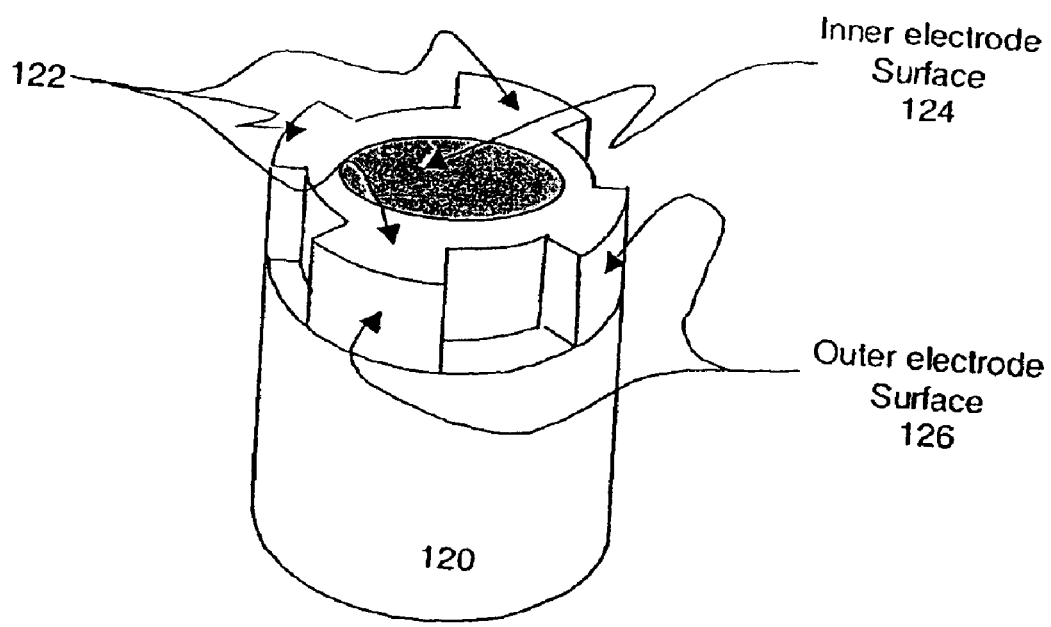
FIG. 10 depicts a radially shaped actuator made of a single slab of homogeneous material.

If periodic patterns as described above and the like, are formed on the outside of a hollow, open ended cylinder of piezoelectric material across a region at one end, the induced strains will cause the end of the cylinder to flare open and close. FIG. 10 depicts a radially shaped actuator 120 made of a single slab of continuous homogeneous material. A topological pattern is formed across a region of the shaped actuator at one end. In this example, a cylinder with a cutout center axial portion is shown, however, other shapes having center axial portions removed may also be employed. The periodicities of the cylinder top end 122 will generate moments causing the top end to flare open and closed upon the application of voltage differences across the electrodes.

Independent, shaped actuators may also be stacked in a vertical fashion, or configured side-by-side.

Bending actuators of the instant invention can be designed to have one shaped side and one planar side as has been demonstrated above, or, both opposing sides of the member can be shaped. Furthermore, the layout of the topology can be changed along the length of the member. In addition, the polarity of the voltage difference applied can be changed along the length or width of the member by forming multiple sets of independent electrodes. For circular or rectangular plate implementations, the topological layout and electrode layout may also be varied about the extent of the plate.

By their nature, bending actuators of the instant invention will be significantly less sensitive to the residual stress issues discussed previously with respect to layered bending actuators. Hence, they will be well suited for MEMS style fabrication. Furthermore, since the assembly of individual components is not required, fabrication at the millimeter and sub-millimeter scale is facilitated.

As mechanical members, shaped actuators exhibit resonance phenomena. Thus, where applicable in terms of mechanical impedance, displacement and other design criteria, shaped active member bending actuators can be employed as resonators.

Shaped Active Member As Bending Sensors

Just as morphs can be used as sensors, non-planar shaped, single slab active members of homogeneous material and non-uniform thickness like those described above can be used as sensors. For example, the general slot design, periodic, bending actuator of FIG. 8 may be constructed as a sensor. By designing the slots so that the stress free neutral axis of the beam does not evenly divide the top electrode 94 to bottom electrode 98 capacitance gap when the device is bent by a mechanical load, a non-zero average electric reaction, proportional to the bending stress in the member develops within this capacitor. The non-zero electrical reaction can then be measured at the electrodes as either a voltage or a charge. In this way, the shaped member is capable of sensing acceleration, pressure, and other mechanical loads applied to it.

Figure 11:
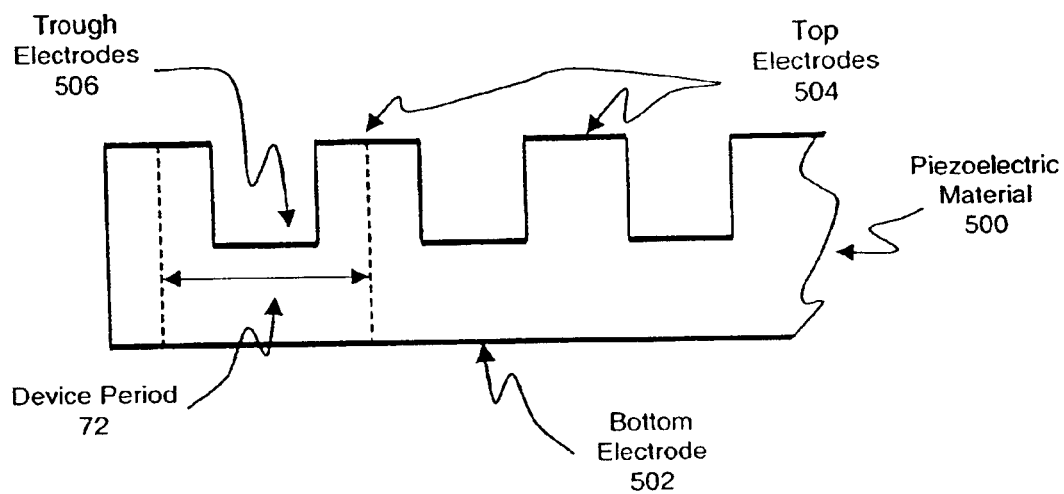
FIG. 11 depicts a cross-sectional view of a periodic shaped member as both an actuator and sensor.

Sensors of the instant invention allow simultaneous access to many different depths within the thickness of the slab. Comparing the output from multiple electrode pairs at different depths can be used to compensate for common mode signals. Hence, a temperature change will cause a common mode change in the output difference between a thicker part and a thinner part while a bending moment will cause a differential output between the thicker and thinner sections. An example design is shown in FIG. 11. Here, the top electrode 304 and the bottom electrode 302 make one capacitance pair while the trough electrode 306 and the bottom electrode 302 make another capacitance pair. Common mode signals will be rejected by tracking the difference of the electrical signals developed across these two capacitors.

Figure 12:
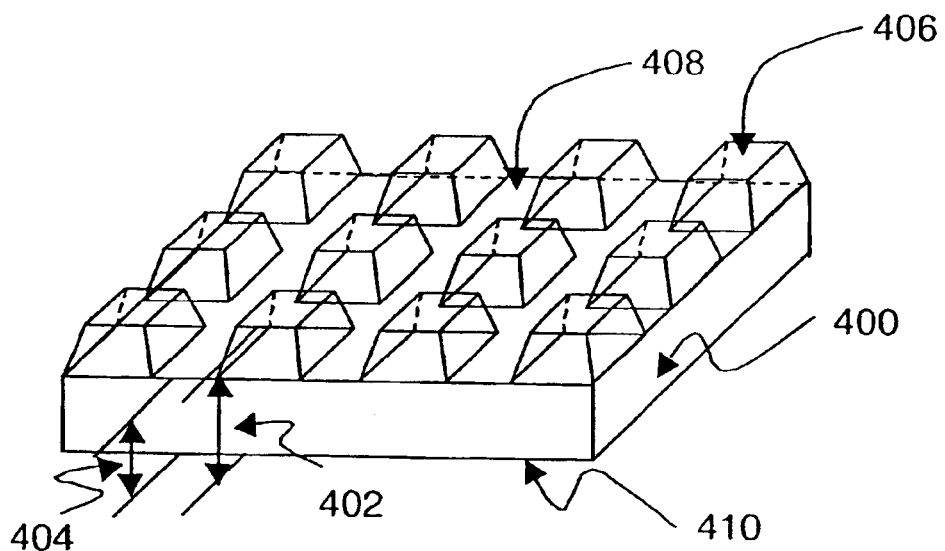
FIG. 12 depicts shaped actuator geometry for infrared and thermal sensing.

Shaped active material slabs sensitive to infrared and temperature may be utilized for infrared and thermal sensing. As in mechanical sensing, access at different depths allows common mode signal rejection. Rejecting the common mode signal is valuable for removing ambient temperature fluctuations from the measurement. As an example, thermally isolating a large, planar device having thicker portions and thinner portions allows a measurement of the difference between the electrical state of the thicker portions relative to the electrical state of the thinner portions of the active member material for the absorption of a quantity of infrared radiation. An example of this type of configuration is shown in FIG. 12. When exposed to incoming infrared energy, the resulting heating in the thicker 402 and thinner 404 portions of the active member material 400 will be different. As a result, the electrical signal developed at the first electrode 406 and the bottom electrode 410 will be different from the electrical signal developed between second electrode 408 and the bottom electrode 410. The difference between these two signals is proportional to the incoming infrared radiation.

Configurations similar to the one described for infrared sensing, in that they have thicker and thinner portions, are also useful for electric and magnetic field sensing. Furthermore, the difference signals generated by sensing at different depths have applications for eliminating temperature effects during inertial measurements.

Access at each of the different depths can alternatively be used to perform various functions. For example, a design in which independent pairs of electrodes, configured such that one set will actuate the device while the other set will measure stress resulting from that actuation, is capable of actuating and sensing simultaneously. An example cross-section of such a device is shown in FIG. 11. The top or input electrodes 502 are electrically connected together to form a capacitor with the bottom electrode 504, and trough or output electrodes 506 are electrically connected together to form another capacitor with the bottom electrodes 504. In this configuration, applying a voltage across the top electrodes with respect to the bottom electrode drives the active member material. A sensing function is simultaneously achieved by monitoring the stress developed in the active member using the trough electrode 506. Alternatively, the trough electrode pair can drive the device while the top electrode pair senses.

Shaped Active Members As Spark Generators, Power Sources, and Voltage Transformers Since the application of mechanical loads to a shaped bending actuator generates voltages at the electrodes, the shaped bending actuator of the instant invention can be readily employed as the active element for a spark generator or an ac voltage source.

Figure 13:
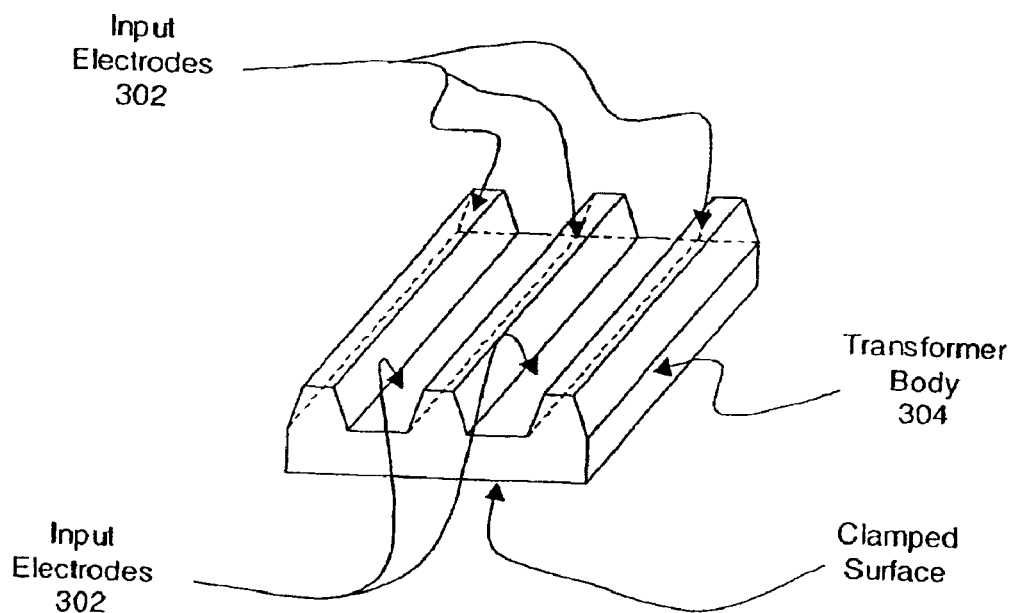
FIG. 13 depicts a voltage transformer design.

In addition, a shaped device can be used as a voltage transformer. As an illustrative example, FIG. 13 depicts a voltage transformer design of the instant invention 300. Here, the bottom electrode 304 is mechanically clamped and one of the electrode pairs is used as the input and one as the output. When an input voltage is applied between the electrodes at the peaks 302 and the bottom electrode 304, a different average stress is developed between the electrodes at the troughs 306 and the bottom electrode 304 than between the top peak electrodes and the bottom electrode, resulting in a different voltage at the second electrode relative to the voltage at the first electrode. This general configuration can perform either step-up or step-down voltage transformation based on the difference in active member material thickness at the first and second electrodes.

Process For Single Slab Bending Actuators and Sensors

Figure 14A:
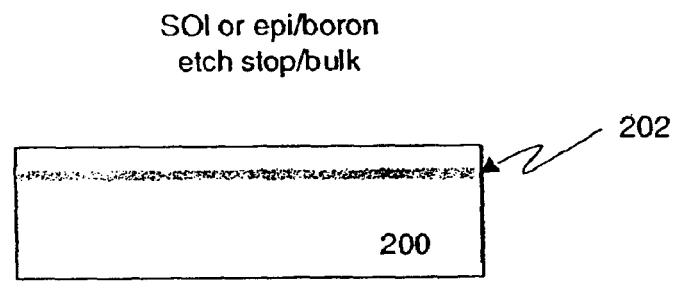
FIGS. 14A–14D depict a process for forming periodic shape actuators using an anisotropic etch.
Figure 14B:
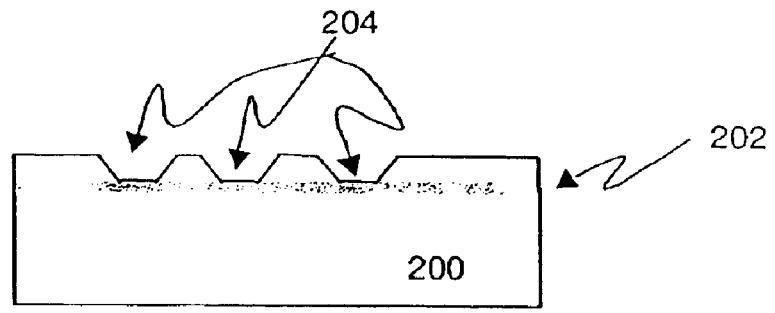
Figure 14C:
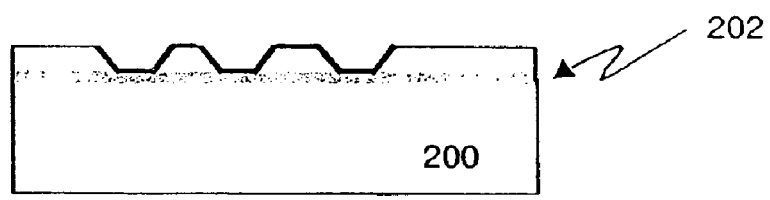
Figure 14D:
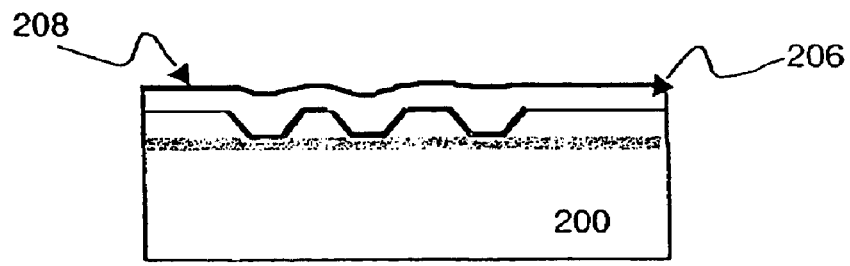
Figure 15A:
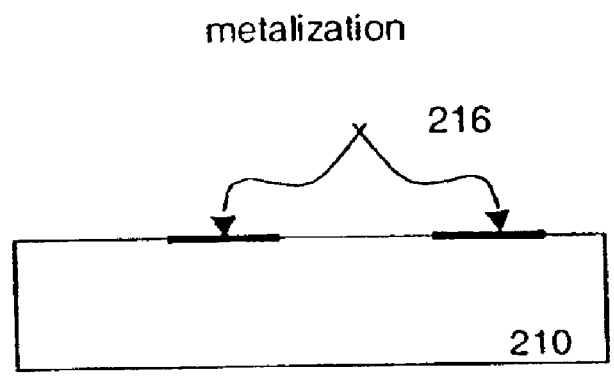
FIGS. 15A–15E depict the process steps for making actuators out of deposited single slabs of continuous, homogeneous material.
Figure 15B:
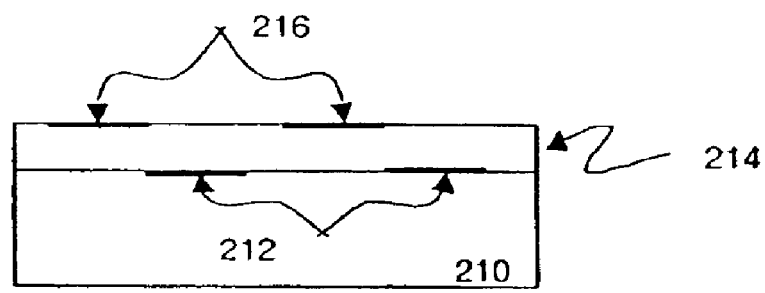
Figure 15C:
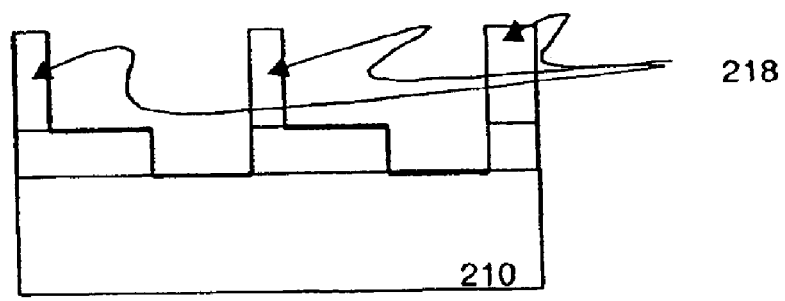
Figure 15D:
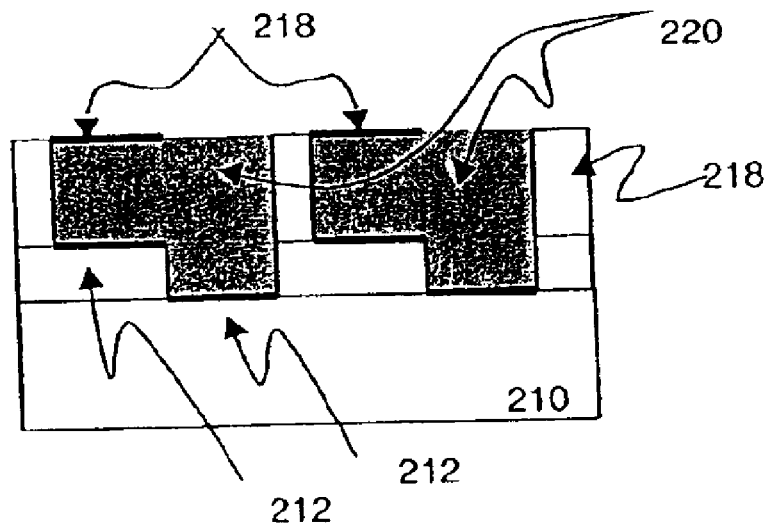
Figure 15E:
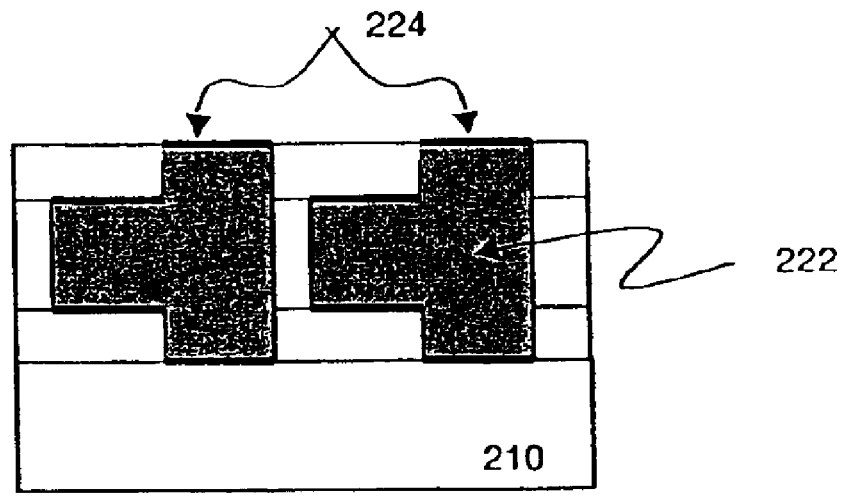

The observation that shaped actuators and sensor of the instant invention, such as periodic bending actuators, have preferable functional characteristics at a sloped angle equal to sixty degrees, is beneficially close to the anisotropic etch angle of <100>silicon, which is 54.7 degrees. This angular match can be utilized to form silicon "molds" that then can be used to form the shaped actuator with a deposition or spin layer over the molded region. A process for forming the aforementioned periodic shape using an anisotropic etch stop is delineated in FIGS. 14A–14D. FIG. 14A depicts a silicon wafer 200 having an SOI or epi/boron etch stop 202 applied. Openings 204 having the desired periodicity are then anisotropically etched, as shown in FIG. 14B. Next the etched wafer top is masked and metallized, FIG. 14C. Last, a spin coat sol-gel of homogeneous piezoelectric material 206 is applied, and the top metallized 208, as demonstrated in FIG. 14D. While the process shown here uses the silicon models directly, a similar process that generates silicon positive molds that can be subsequently used to generate other negative molds is also envisioned.

FIG. 15 depicts the process steps for making a single slab actuator and sensors of the instant invention out of deposited layers of continuous, homogeneous active material. First, as shown in FIG. 15A, a segmented layer of metal 212 is applied to the top surface of a wafer 210. A mask layer 214, polyimide, or the like, is then applied, and a second patterned layer of metal 216 is introduced, FIG. 15B, the second layer being adjacent to the first layer, and not overlapping the first layer. FIG. 15C depicts the wafer 210 after the application of a second mask 218, a polyamide, and further etching. The resultant wafer of FIG. 15C is then filled with a single slab active member of continuous homogeneous material 220 adapted to form non-uniform fields therein when subjected to an external field, such as a piezoelectric material (slo-gel), patterned, and metallized 222, as shown in FIG. 15D. In a similar fashion, a third mask is then added, typically a polyimide, etched, filled with the same material 220, and metallized 224 a final time, as shown in FIG. 15E. The resultant product is a single slab bending actuator of homogeneous material and non-uniform thickness having metallized electrodes on its surfaces. For this bending actuator, the actuation direction is in the plane of the wafer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for actuation comprising a non-planar shaped, single active member slab of continuous homogeneous material and non-uniform thickness for bending, said apparatus having non-uniform fields induced therein when subjected to an external field, said non-uniform fields defined by said non-planar shape and generating moments to bend said apparatus.

2. The apparatus of claim 1 wherein said homogeneous material further comprises having measurable physical parameters responsive to a distribution of said non-uniform fields.

3. The apparatus of claim 1 further comprising having said non-planar shape designed to adjust non-uniformity of said non-uniform fields to reduce internal stress within said single active member slab.

4. The apparatus of claim 3 wherein said non-uniformity of said non-uniform fields reduces internal stress through a linear distribution of said non-uniform fields.

5. The apparatus of claim 1 further comprising having said non-uniform fields defined by said non-planar shape and electrode placement on said single active member slab.

6. The apparatus of claim 1 wherein said non-planar shaped, single active member slab of continuous homogeneous material bends in response to induced strain developed from said non-uniform fields.

7. The apparatus of claim 1 comprising a single layer of continuous homogeneous piezoelectric, electrostrictive or magnetostrictive material.

8. The apparatus of claim 1 wherein said external field comprises electric, magnetic, or electromagnetic fields.

9. The apparatus of claim 1 wherein said non-planar shaped, single active member slab further comprises a non-rectilinear shape adapted to alter internal fields induced by said external field and enhance field non-uniformity therein.

10. The apparatus of claim 1 wherein said non-planar shaped, single active member slab further comprises straight-edged surfaces adapted to alter internal fields induced by said external field and enhance field non-uniformity therein.

11. The apparatus of claim 10 further comprising said active member slab as a piecewise planar slab.

12. The apparatus of claim 6 wherein said non-planar shaped, single active member slab of continuous homogeneous material comprises a first internal region of lesser strain and a second internal region of greater strain when said active member is subjected to said external field.

13. The apparatus of claim 12 wherein said induced strain varies as a linear function, a square-root function, or as a square function with respect to said non-uniform thickness of said apparatus.

14. The apparatus of claim 1 wherein said single layer active member comprises a diaphragm or membrane shape having non-uniform thickness.

15. The apparatus of claim 1 further comprising a plurality of said non-planar shaped, single active member slabs of continuous, homogeneous material bonded together, wherein each of said single active member slabs has non-uniform fields induced therein when subjected to an external field, said non-uniform fields defined by said non-planar shape and generating moments to bend each of said single active member slabs independently.

16. The apparatus of claim 15 further comprising having said plurality of said non-planar shaped, single active member slabs in a vertically stacked configuration.

17. The apparatus of claim 15 further comprising having said plurality of said non-planar shaped, single active member slabs in a side-by-side configuration.

18. The apparatus of claim 2 wherein said measurable physical parameters include force related properties.

19. The apparatus of claim 18 wherein said force related properties comprise stress and strain.

20. An apparatus comprising a non-planar shaped, single active member slab of continuous homogeneous material and non-uniform thickness for sensing, said apparatus having fields induced therein when subjected to an external energy, said fields defined by said non-planar shape and generating non-zero average electrical reactions to said external fields, causing said apparatus to sense.

21. The apparatus of claim 20 further comprising having said non-planar shaped, single layer active member of homogeneous material induce a potential difference across portions or all of said single layer active member when said active member is subjected to said external energy.

22. Apparatus of claim 21 where the said external energy comprises infrared radiation, electric fields, magnetic fields, pressure, acceleration, or mechanical loading.

23. The apparatus of claim 22 wherein said active member slab comprises at least one thicker portion and at least one thinner portion, and generating said potential difference between said at least one thicker portion and said at least one thinner portion when said slab is exposed to said external energy.

24. The apparatus of claim 20 further comprising a single layer of homogeneous piezoelectric, electrostrictive, magnetostrictive, or pyroelectric material.

25. The apparatus of claim 20 further comprising a topological pattern repeated across at least one surface of said active member.

26. An apparatus for bending comprising a continuous homogeneous, single active member slab of non-planar geometry having a first portion and a second portion, said apparatus having non-uniform fields induced therein when subjected to an external field, said non-uniform fields producing approximately no strain in said first portion and strain responsive to said non-uniform fields in said second portion, and generating moments to bend said apparatus.

27. The apparatus of claim 26 comprising a single layer of continuous homogeneous piezoelectric, electrostrictive, or magnetostrictive material.

28. An apparatus for bending comprising a continuous homogeneous, single active member slab of non-planar geometry having a first active portion and a second active portion, said apparatus having non-uniform fields induced therein when subjected to an external field, said non-uniform fields producing strain fields responsive to said external fields, said strain fields induced in said first active portion different from said strain fields induced in said second active portion, and generating moments to bend said apparatus.

29. The apparatus of claim 28 comprising having said strain fields in said first active portion of a different strength or polarity of said strain field in said second active portion.

30. A voltage transformer comprising a non-planar shaped, single active member slab of continuous homogeneous material and non-uniform thickness, a first electrode pair, and a second electrode pair, said transformer having non-uniform fields induced therein when a first potential difference is applied across said first electrode pair, said non-uniform fields defined by said non-planar shape and causing said transformer to generate a second potential difference across said second electrode pair.

31. The voltage transformer of claim 30 comprising said first electrode pair having a first top electrode and a bottom electrode, and said second electrode pair having a second top electrode and said bottom electrode, one of said electrode pairs used as an input and the other of said electrode pair used as an output for said voltage transformer.

32. The voltage transformer of claim 30 comprising a first stress developed between said first electrode pair and a second stress developed between said second electrode pair, said first stress different from said second stress, said first and second stress not expressed as strain.

33. The voltage transformer of claim 30 comprising a step-up or step-down voltage transformation based on a difference in active member material non-uniform thickness at the first and second electrodes.

34. The voltage transformer of claim 31 comprising said first top electrode attached to a peak on said top surface, said second top electrode attached to a trough on said top surface.

35. The voltage transformer of claim 30 comprising a mechanically clamped portion of said single active member slab.

36. The voltage transformer of claim 30 comprising a topological pattern repeated across at least one surface of said active member.

37. A bending actuator comprising a non-planar shaped, single active member slab of continuous homogeneous material, said slab including a top, a bottom, a non-uniform thickness, a bending portion, a predetermined direction of bending, said top and bottom aligned in said predetermined direction of bending; said bending portion mechanically unrestrained in said predetermined direction of bending.

38. The bending actuator of claim 37 further comprising having said bending portion adapted to displace through said predetermined direction of bending when said bending actuator is subjected to an external field.

39. An apparatus comprising a non-planar shaped, single active member slab of continuous homogeneous material and non-uniform thickness for generating electrical power, said apparatus having fields induced therein when subjected to an external energy, said fields defined by said non-planar shape and generating non-zero average electrical reactions to said external fields, causing said apparatus to transform said external energy to electrical energy.

40. The apparatus or claim 39 wherein said external energy comprises mechanical energy.

* * * * *